(12) United States Patent
Matsumoto et al.

(10) Patent No.: US 7,812,570 B2
(45) Date of Patent: Oct. 12, 2010

(54) CURRENT DETECTION APPARATUS FOR A CAR POWER SOURCE

(75) Inventors: Akira Matsumoto, Kakogawa (JP); Masaki Yugou, Kakogawa (JP)

(73) Assignee: Sanyo Electric Co., Ltd., Osaka (JP)

( * ) Notice: Subject to any disclaimer, the term of this patent is extended or adjusted under 35 U.S.C. 154(b) by 244 days.

(21) Appl. No.: 12/076,077

(22) Filed: Mar. 13, 2008

(65) Prior Publication Data

US 2008/0224665 A1    Sep. 18, 2008

(30) Foreign Application Priority Data

Mar. 16, 2007    (JP)    ............... 2007-068593

(51) Int. Cl.
*H02J 7/00* (2006.01)
(52) U.S. Cl. .................................... 320/134
(58) Field of Classification Search ........... 320/149, 320/162
See application file for complete search history.

(56) References Cited

U.S. PATENT DOCUMENTS 6,049,210 A * 4/2000 Hwang ............... 324/428
6,335,611 B1 * 1/2002 Sasaki ............... 320/134
7,050,914 B2 * 5/2006 Tzeng et al. ............... 702/64
7,095,212 B2 * 8/2006 Sudo et al. ............... 320/136
7,679,418 B2 * 3/2010 Vlasenko ............... 327/333
2003/0169078 A1    9/2003 Onishi

FOREIGN PATENT DOCUMENTS

EP    0 464 748    1/1992
JP    2002-062341    2/2002

OTHER PUBLICATIONS

European Search Report (in English language) issued May 20, 2010 in corresponding European Patent Application No. 08 00 4793.

* cited by examiner

*Primary Examiner*—Edward Tso
*Assistant Examiner*—Ramy Ramadan
(74) *Attorney, Agent, or Firm*—Wenderoth, Lind & Ponack, L.L.P.

(57) ABSTRACT

A current detection apparatus includes a current detection section that detects charging current and discharging current of the car driving battery, a level-shift circuit connected to the output-side of the current detection section that shifts the output of the current detection section, and an A/D converter connected to the output-side of the level-shift circuit. The level-shift circuit shifts the current detection section output signal to unbalance the maximum discharging current and maximum charging current that can be detected.

17 Claims, 7 Drawing Sheets

PRIOR ART

CURRENT DETECTION APPARATUS FOR A CAR POWER SOURCE

BACKGROUND OF THE INVENTION

1. Field of the Invention

The present invention relates to a current detection apparatus to detect driving battery charging current and discharging current in a car power source apparatus.

2. Description of the Related Art

In a car power source apparatus, it is important to accurately compute remaining capacity of the driving battery. If error develops in detecting remaining battery capacity, that error accumulates as driving time increases. Cumulative error, which is the difference in remaining capacity between actual remaining battery capacity and computed remaining battery capacity, can become a cause of battery over-charging and battery over-discharging. Battery electrical characteristics degrade markedly with over-charging and over-discharging leading to shorter battery lifetime. Since a car driving battery is extremely expensive, it is important to enable its use for as long a period as possible. Further, in limiting the range of remaining battery capacity to avoid over-charging and over-discharging, the usable range narrows as the cumulative error increases resulting in vehicle driving limitations.

Remaining battery capacity is computed by integrating current flowing through the battery. Remaining capacity is computed by subtracting the integrated value of discharging current from the integrated value of charging current while considering charging efficiency and discharging efficiency. To accurately compute remaining capacity, it is necessary to accurately detect battery current. Here, an analog signal detected by a battery current sensor is converted to a digital signal by an analog-to-digital (A/D) converter, and that digital signal is operated on by a current correction circuit to compute remaining capacity. The current detection apparatus detects battery discharging current and charging current with a current sensor. The analog signal output from the current sensor is converted to a digital signal by an A/D converter and input to a computing circuit to compute remaining capacity. FIG. 1 shows the output characteristics of a current sensor. In a current sensor with these characteristics, output voltage increases as discharging current increases, and output voltage decreases as charging current increases. The current sensor of FIG. 1 detects 200 A of charging current and discharging current and outputs a voltage proportional to the current. Specifically, this current sensor detects change in current over 400 A and outputs a voltage signal from 0V to 10V.

An output signal from the current sensor is input to the A/D converter and the digital signal output from the A/D converter is operated on by the computing circuit to detect battery current. With a detected current of 0 A as its center-point, the current sensor detects charging currents and discharging currents having the same maximum current value. However, under actual battery operating conditions, maximum charging current and maximum discharging current are not equal. Battery charging current and discharging current are controlled by the battery ECU, and maximum charging current is controlled to a smaller value than maximum discharging current. This is to optimize driving conditions while protecting the battery. By allowing discharging current that is as large as possible, desired performance such as accelerating power can be offered to the driver. However, if a large amount of charging current is supplied to the battery, there is concern that a rapid rise in battery charging voltage could result. If the battery is over-charged to the point where the specified voltage of the system is exceeded, not only is battery lifetime reduced, but in the worst-case, safety concerns are introduced such as battery electrolyte leakage. Consequently, a current detection circuit that detects the same range for charging current and discharging current cannot detect current with high precision. This is because the precision of 1-bit of digital signal converted by the A/D converter is coarse in such a system. For example, an apparatus that converts current in a 400 A range to a 10-bit digital signal has a 1-bit precision of 400/1024 A.

As an apparatus to resolve these drawbacks, the present inventor previously developed a detection apparatus with charging current and discharging current switching to detect current with high precision. Details of that apparatus are cited in Japanese Laid-Open Patent Publication No. 2002-62341.

SUMMARY OF THE INVENTION

FIG. 2 shows the circuit diagram of an apparatus for Japanese Laid-Open Patent Publication No. 2002-62341. This apparatus is provided with a current sensor 80 to detect battery 81 charging current and discharging current. The output signal from the current sensor 80 is input to a special-purpose discharging current amplifier 82, which houses a pair of operational amplifiers (op-amps) 91, 92, and to a special-purpose charging current amplifier 83, which houses a pair of op-amps 93, 94. Here, output-amps 91, 92 have different gains than output-amps 93, 94. Output from each amplifier is input via switches 84, 85 to a micro-controller 86 containing an AND converter having a fixed number of bits. The gain of respective op-amps is changed based on the average current value computed by arithmetic operations of the micro-controller 86.

The apparatus of FIG. 2 can detect current with high precision by optimally adjusting the charging current range and the discharging current range via the gain of respective op-amps. However, since this apparatus detects charging current and discharging current by switching between dedicated op-amps, its circuit structure becomes complex. Furthermore, since the gain of the op-amps affects the detection precision, op-amp gain error can be a cause of lower detection precision.

The present invention was developed to further resolve these drawbacks. Thus, it is a primary object of the present invention to provide a current detection apparatus for a car power source that can detect, with high precision, charging current and discharging current having different maximum detection ranges, while maintaining a simple circuit structure.

The current detection apparatus for a car power source of the present invention is provided with a current detection section 20, 30 to detect charging current and discharging current of the car driving battery 10, a level-shift circuit 40, 50 connected to the output-side of the current detection section 20, 30 to shift the output of the current detection section 20, 30, and an A/D converter 60 connected to the output-side of the level-shift circuit 40, 50. The level-shift circuit 40, 50 shifts the current detection section 20, 30 output signal to unbalance the maximum discharging current and maximum charging current that can be detected.

The current detection apparatus for a car power source described above has the characteristic that it can detect charging current and discharging current having different maximum detection ranges with high precision while having an extremely simple circuit structure. This is because the current detection apparatus of the present invention has a level-shift circuit connected to the output-side of the current detection section, which detects battery discharging current and charging current, and that level-shift circuit shifts the current detection section output signal for input to the A/D converter.

FIG. 3 shows the operating principles of the current detection apparatus described above. In FIG. 3, straight line A shows the output characteristics of the current detection section. This current detection section detects current from 200 A of charging current to 200 A of discharging current. At 200 A of charging current, its output voltage is 0V, and at 200 A of discharging current, its output voltage is 10V. The output voltage of this current detection section increases as discharging current increases and decreases as charging current increases. At the point of 0 A of discharging current and 0 A of charging current, current detection section output voltage is at the half-scale voltage of 5V. In prior-art current detection apparatus, straight-line output A is converted to the broken line D by an amplitude adjustment circuit, and then input to the A/D converter. The A/D converter converts 0V to 5V input voltage to a digital signal. The prior-art current detection apparatus converts current over a 400 A current range to a digital output signal. A 10-bit A/D converter converts input voltage to a digital output signal having discrete steps with a weight of 1/1024. Consequently, the single-bit precision of the prior-art current detection apparatus is 400/1024 A.

In the current detection apparatus of the present invention, points on straight-line A output from the current detection section are level-shifted by the level-shift circuit to from straight-line B with unbalanced charging and discharging current. Straight-line B is obtained from straight-line A by a level-shift of −1.25V. In the level-shifted straight-line B, charging current at the 0V point is changed from 200 A to 150 A. Full-scale discharging current remains unchanged at 200 A. An amplitude adjustment circuit changes the voltage range of straight-line B to that of straight-line C, which is the 0V to 5V input voltage range of the A/D converter. Points on straight-line C, which range from 150 A of charging current at 0V to 200 A of discharging current at 5V, are input to the A/D converter. As a result, the A/D converter outputs a digital signal having a 350 A range from 150 A of charging current to 200 A of discharging current. Consequently, the single-bit precision of a digital signal output from a 10-bit A/D converter is changed from 400/1024 to 350/1024 allowing current detection with greater accuracy. The current detection apparatus of the present invention is not provided with special-purpose op-amps having different gains for charging current and discharging current as in prior-art apparatus. Instead, a simple level-shift circuit level-shifts current detection section output signals to freely adjust charging current full-scale and discharging current full-scale values. This allows unrestricted optimization of the detected current range to improve A/D converter precision. In particular, level-shift is implemented with extremely simple circuit structure that either inputs a level-shift direct current (DC) voltage to one input terminal of a difference amplifier or inputs a DC bias voltage at the input-side of an amplifier.

In the current detection apparatus of the present invention, the level-shift circuit 40 can be a difference amplifier 41. In a level-shift circuit 40 that is a difference amplifier 41, current detection section 20, 30 output is input to one input terminal and a DC compensation voltage is input to the other input terminal to shift the current detection section 20, 30 output signal by the compensation voltage and input it to the A/D converter 60.

In the current detection apparatus of the present invention, the level-shift circuit 50 can be an adder circuit 51. In this level-shift circuit 50, a DC bias voltage is input to the input-side of the adder circuit 51 to shift the current detection section 20, 30 output signal by the DC bias voltage and input it to the A/D converter 60.

In the current detection apparatus of the present invention, the current detection section 20, 30 can have output characteristics that show decreasing output voltage with increasing charging current and increasing output voltage with increasing discharging current.

The current detection apparatus of the present invention can be provided with an amplitude adjustment circuit 61 at the output-side of the level-shift circuit 40, 50 to adjust the magnitude of the output voltage swing of the level-shift circuit 40, 50 to the input range of the AND converter 60.

In the current detection apparatus of the present invention and in addition to the configuration according to another aspect, a level-shift circuit op-amp can serve the dual purpose as an amplitude adjustment circuit. In this current detection apparatus, the amplitude of the level-shift circuit output voltage is adjusted to the input range of the A/D converter by the gain of the op-amp. The above and further objects of the present invention as well as the features thereof will become more apparent from the following detailed description to be made in conjunction with the accompanying drawings.

DETAILED DESCRIPTION OF THE INVENTION

Figure 1:
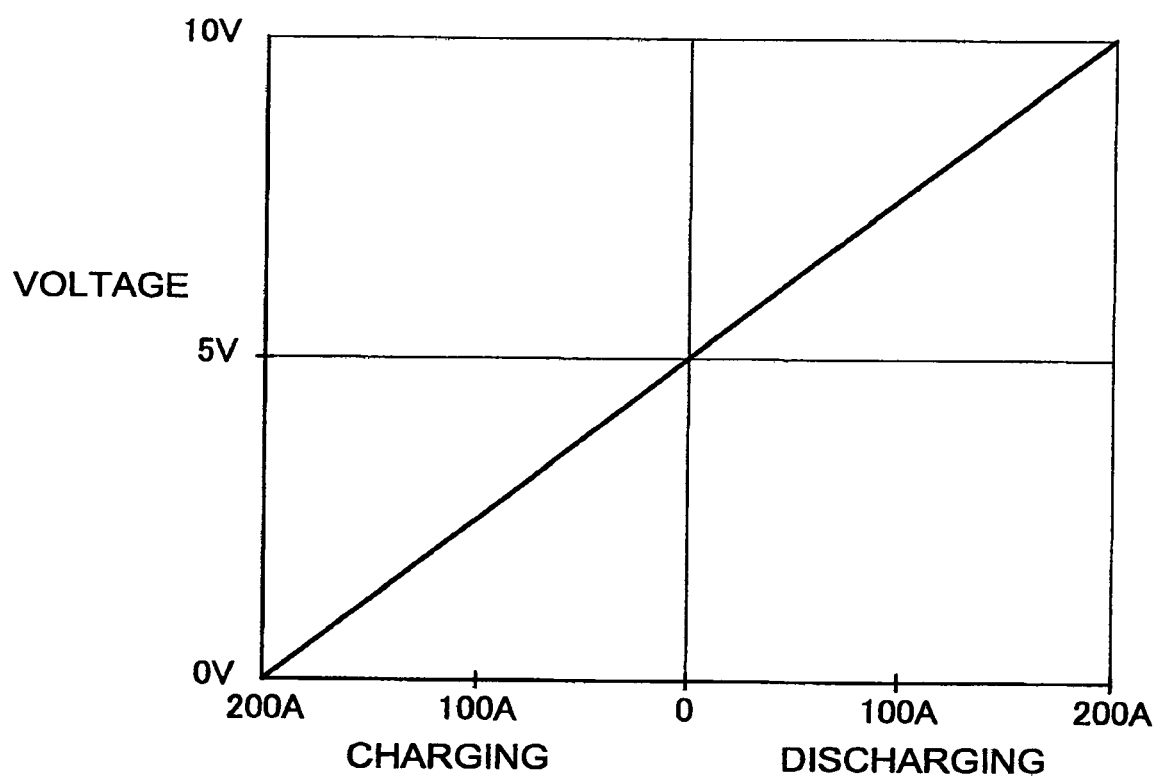
FIG. 1 is a graph showing one example of the output characteristics of a current sensor.
Figure 2:
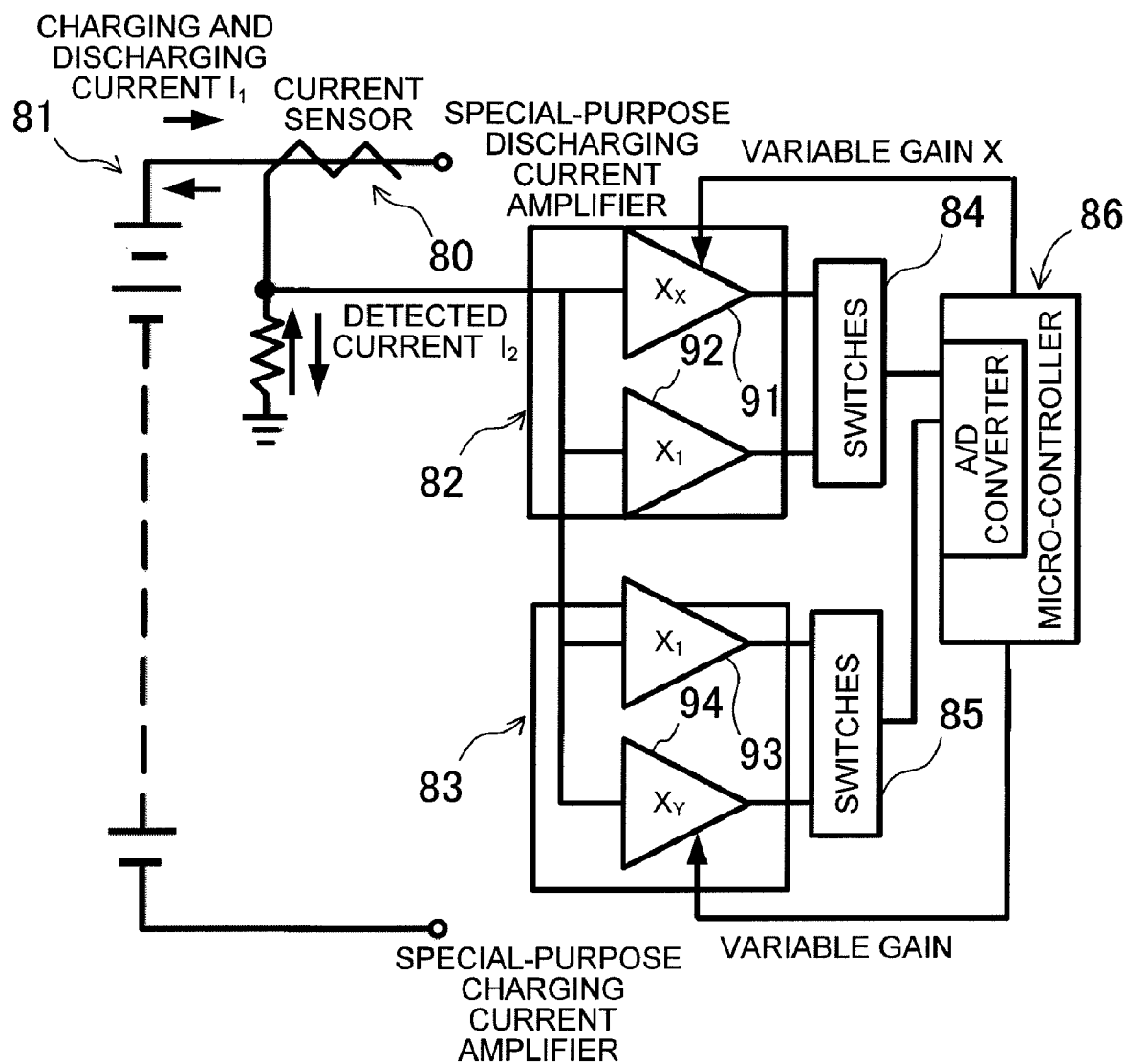
FIG. 2 is a circuit diagram of a prior-art current detection apparatus.
Figure 3:
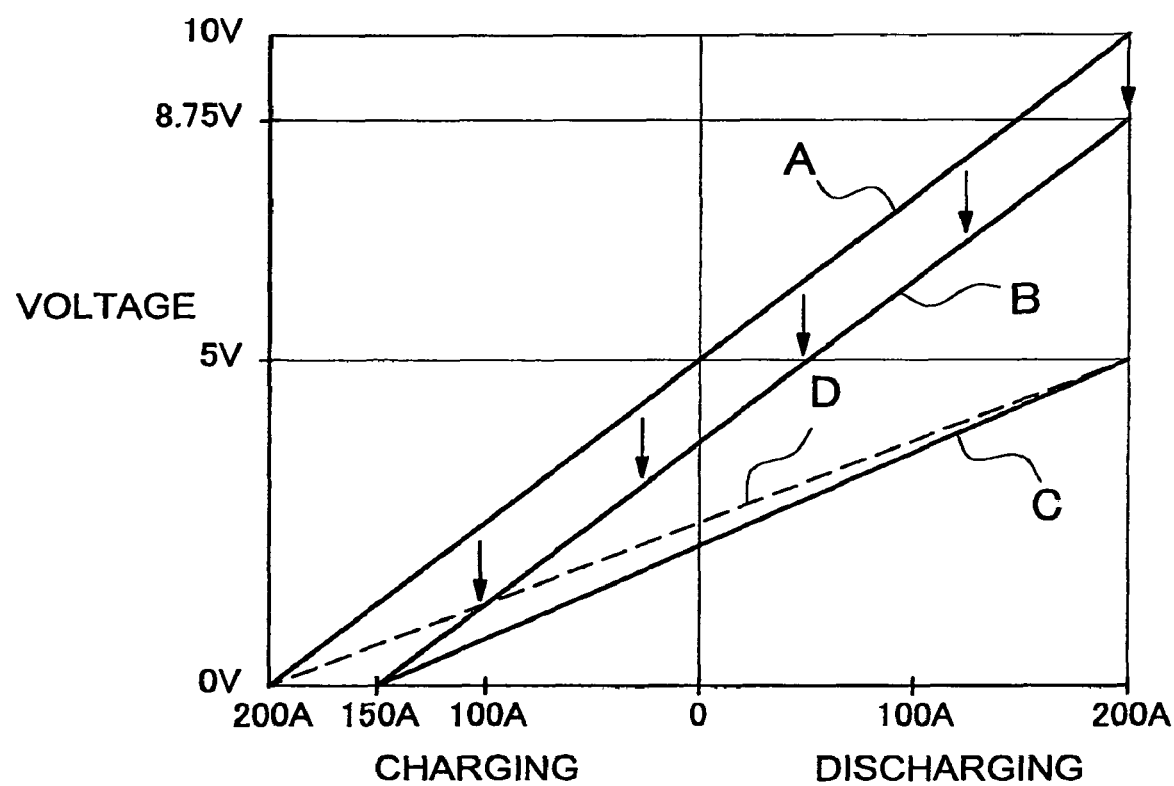
FIG. 3 is a graph showing operating principles for one example of a current detection apparatus of the present invention.

The current detection apparatus for a car power source shown in FIGS. 4-7 is provided with a current detection section 20, 30 to detect the charging current and discharging current of a driving battery 10 installed in a car, a level-shift circuit 40, 50 connected to the output-side of the current detection section 20, 30 to shift the output of the current detection section 20, 30, and an A/D converter 60 connected to the output-side of the level-shift circuit 40, 50.

The driving battery 10 of the car power source is connected to a motor 12 and generator 13 through a DC/AC inverter 11. The motor 12 discharges the battery 10, and the generator 13 charges the battery 10. Battery 10 discharging current and charging current are controlled by the battery ECU 14. The battery ECU 14 controls motor 12 discharging current based on vehicle driving conditions and battery 10 remaining capacity. Specifically, the battery ECU 14 controls motor 12 output to control power that drives the car. Further, the battery ECU 14 controls battery 10 charging current based on battery 10 remaining capacity and regenerative braking of the car.

As shown in the graphs of FIGS. 4-7, the battery ECU 14 controls higher discharging currents than charging currents. In these graphs, maximum current for discharging the battery 10 is 200 A, and maximum current for charging the battery 10 is 150 A. In this type of power source having higher discharging current than charging current, battery 10 degradation can be prevented while delivering high output from the motor 12 that drives the vehicle. This is because motor 12 output can be increased while avoiding battery 10 degradation due to high charging currents. The effect on battery 10 degradation is greater for high charging current than for high discharging current. There is concern that the maximum tolerable voltage of the system could be exceeded in the case of high current during charging. If a situation occurs repeatedly where the design voltage of the battery itself is exceeded, battery degradation will proceed. Therefore, to increase motor output while avoiding battery 10 degradation, it is necessary to control charging current to lower values than discharging current. Although the car power source of the figures has a maximum current of 200 A for battery 10 discharging and a maximum current of 150 A for battery 10 charging, it does not necessarily have to have discharging and charging current maximum values of 200 A and 150 A. If the weight of the vehicle and battery capacity is large, the car power source may have higher maximum values for discharging and charging currents.

Figure 4:
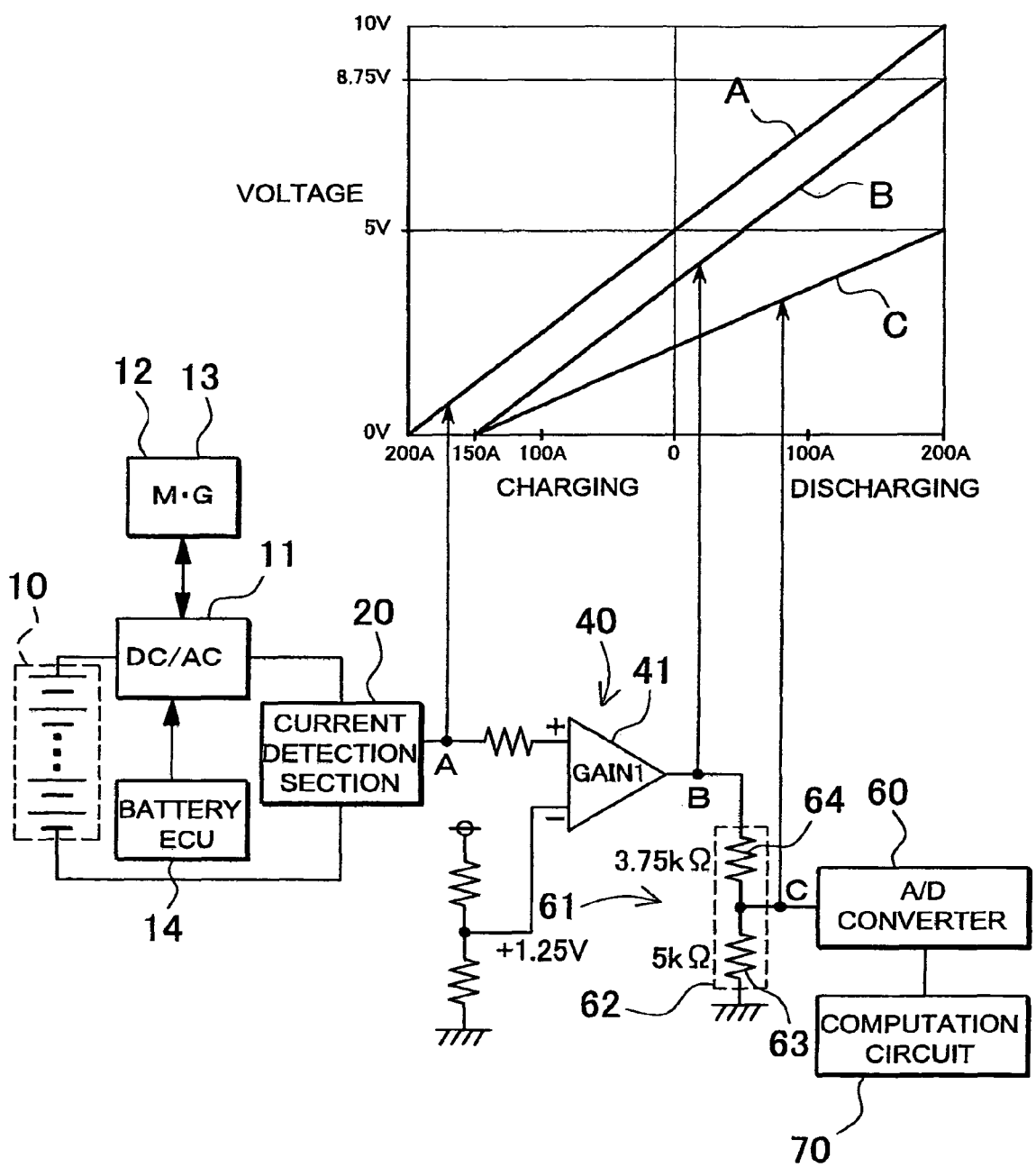
FIG. 4 is a block diagram of a current detection apparatus for one embodiment of the present invention and a graph showing its operating principles.
Figure 5:
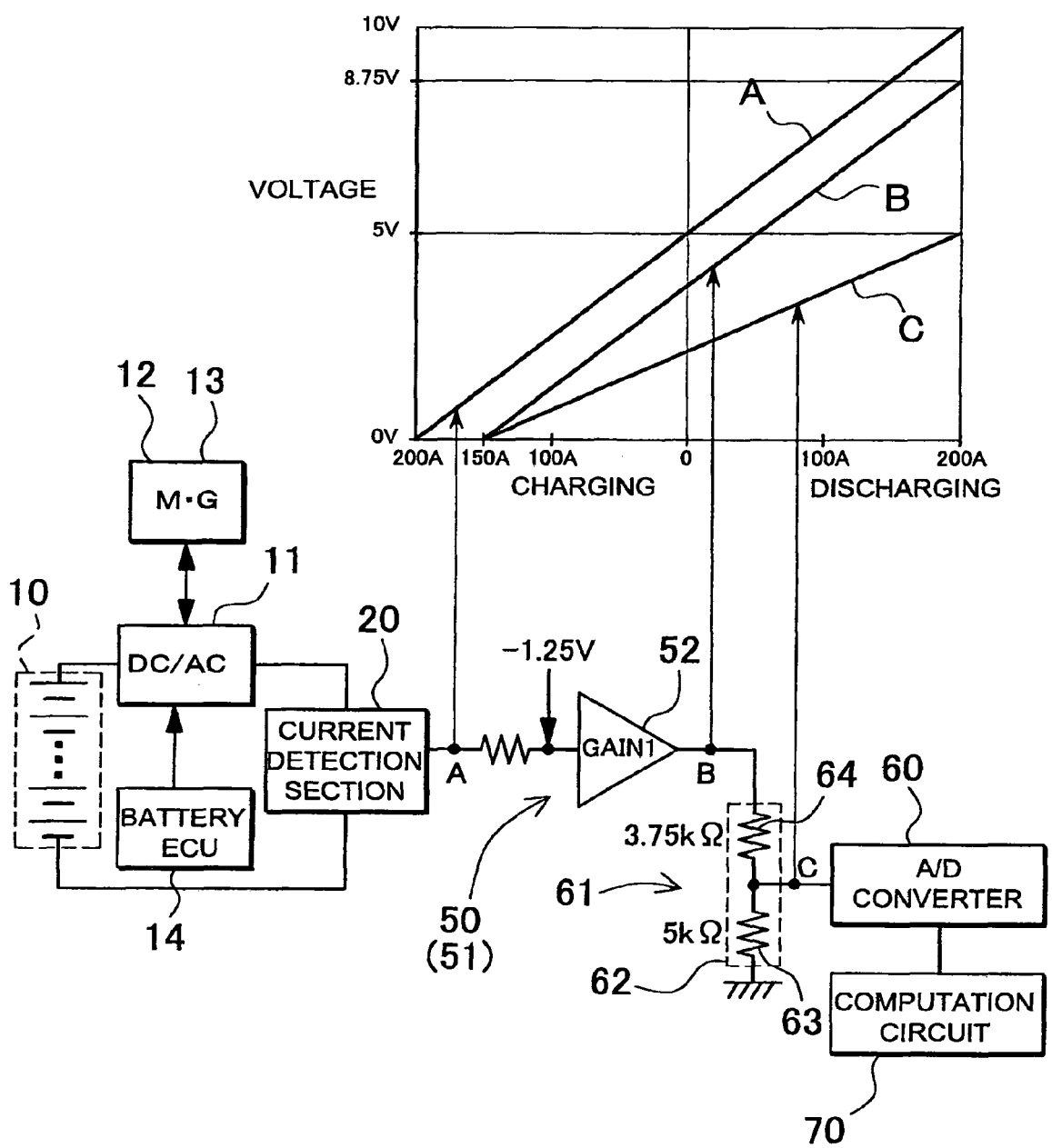
FIG. 5 is a block diagram of a current detection apparatus for another embodiment of the present invention and a graph showing its operating principles.
Figure 6:
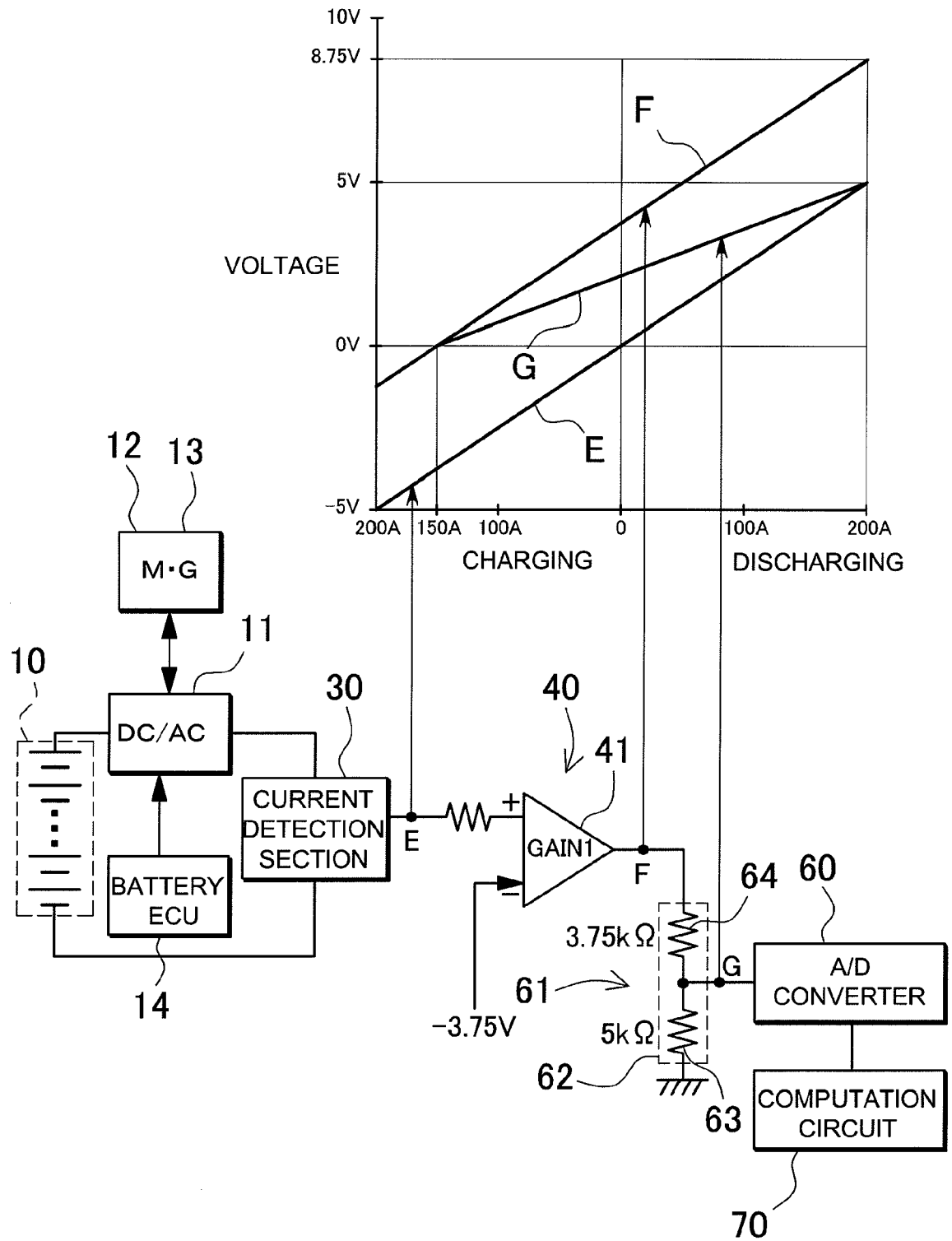
FIG. 6 is a block diagram of a current detection apparatus for another embodiment of the present invention and a graph showing its operating principles.
Figure 7:
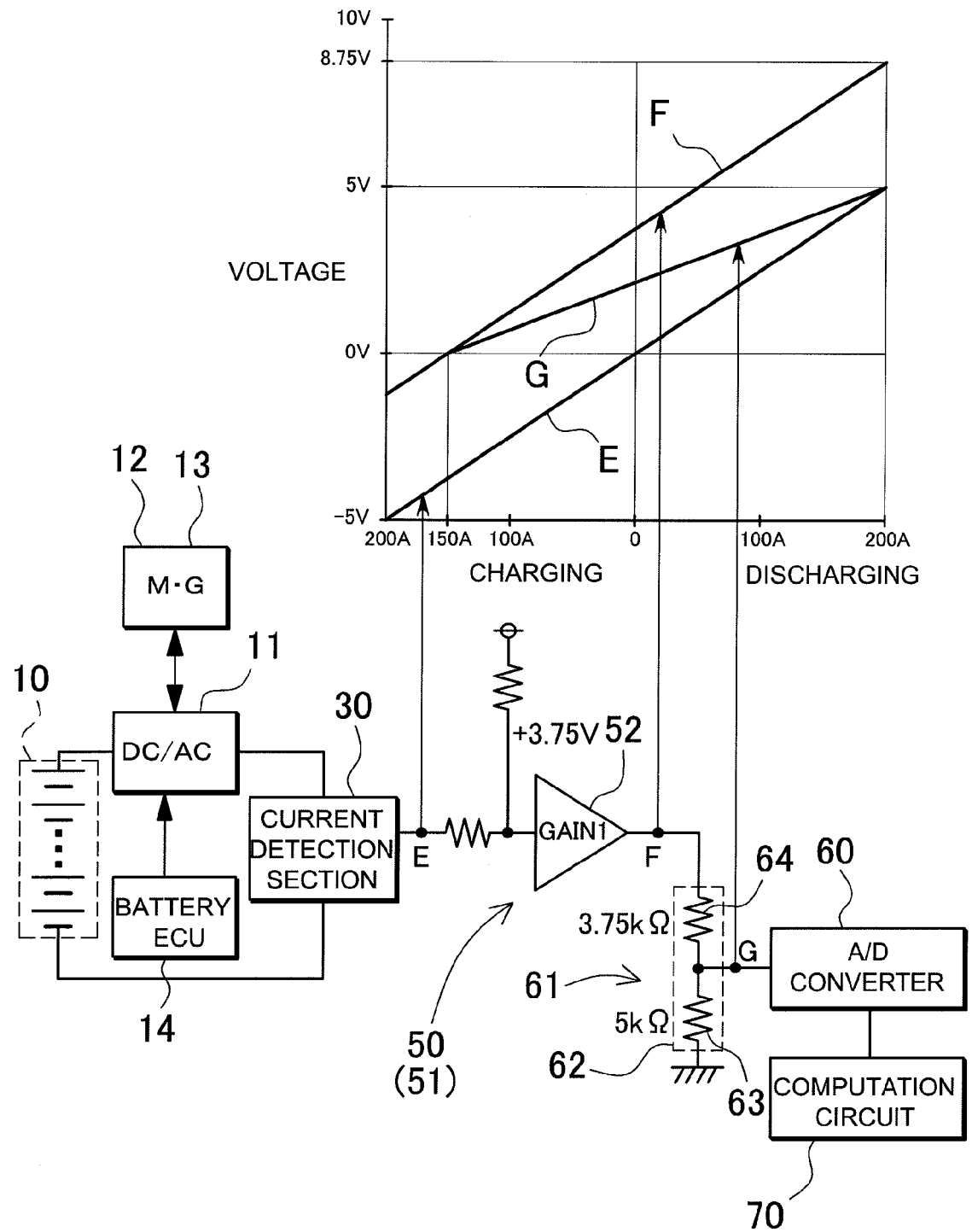
FIG. 7 is a block diagram of a current detection apparatus for another embodiment of the present invention and a graph showing its operating principles.

Output characteristics of the current detection section 20 shown in FIGS. 4 and 5 are different from those of the current detection section 30 shown in FIGS. 6 and 7. The graphs of FIGS. 4 and 5 show the output characteristics of the current detection section 20. In these graphs, current detection section 20 output voltage is 0V for 200 A of charging current, 10V for 200 A of discharging current, and 5V for the 0 A current state. In this current detection section 20, output voltage increases linearly with discharging current, and decreases linearly with charging current. Furthermore, the rate of change in output voltage with respect to input current is the same for discharging current as it is for charging current. In the current detection section 30 with the output characteristics shown in the graphs of FIGS. 6 and 7, output voltage is 0V for the 0 A current state, 5V for 200 A of discharging current, and −5V for 200 A of charging current. For the current detection sections 20, 30 of FIGS. 4-7, output voltage increases linearly as battery 10 current increases in the discharging direction.

The level-shift circuit 40, 50 does not input an output signal to the A/D converter 60 with a 200 A charging current range and a 200 A discharging current range. Specifically, output voltage from the current detection section 20, 30 is level-shifted to limit its range for input to the A/D converter 60. The level-shift circuit 40, 50 shown in FIGS. 4-7 shifts the output voltage of the current detection section 20, 30 to a voltage signal, which corresponds to a current range from a maximum charging current of 150 A to a maximum discharging current of 200 A, for input to the A/D converter 60.

The straight-line A of FIGS. 4 and 5 shows the output characteristics of the current detection section 20. The output signal from a current detection section 20 having these output characteristics is input to the level-shift circuit 40, 50. The level-shift circuit 40, 50 shifts the level of the straight-line A input signal to straight-line B. This level-shift circuit 40, 50 shifts the level of the input signal by −1.25V. Straight-line B, which is level-shifted from straight-line A, results in a 0V output signal corresponding to a charging current of 150 A detected by the current detection section 20. Although the level-shift circuit 40, 50 shifts the level of straight-line A to straight-line B, the change in output voltage for a given change in input current (the slope) remains the same. Specifically, straight-line B is shifted parallel to straight-line A.

Therefore, the output voltage of the level-shift circuit 40, 50 for a discharging current of 200 A is level shifted from 10V to 8.75V (10V−1.25V).

The straight-line E of FIGS. 6 and 7 shows the output characteristics of the current detection section 30. This current detection section 30 has an output voltage of 0V for the 0 A current state. The output signal from the current detection section 30 with these output characteristics is level-shifted to straight-line F by the level-shift circuit 40, 50. Specifically, the level-shift circuit 40, 50 shifts the signal input from the current detection section 30 by +3.75V. Straight-line F, which is level-shifted from straight-line E, results in a 0V output signal corresponding to a charging current of 150 A detected by the current detection section 30. Although the level-shift circuit 40, 50 shifts the level of straight-line E to straight-line F, the slope of the line is unchanged and straight-line F is shifted parallel to straight-line E. Therefore, the output voltage of the level-shift circuit 40, 50 for a discharging current of 200 A is level shifted by 3.75V from 5V to 8.75V (5V+ 3.75V).

The level-shift circuit 40, 50 is implemented by a gain=1 difference amplifier 41 or adder circuit 51. A level-shift circuit 40 implemented by a difference amplifier 41 is shown in FIGS. 4 and 6, and an adder circuit 51 level-shift circuit 50 is shown in FIGS. 5 and 7.

In the difference amplifier 41 of FIGS. 4 and 6, the current detection section 20, 30 output signal is input to the non-inverting side (+side) input terminal and a compensation voltage is input to the inverting side (−side) input terminal to shift the level of the current detection section 20, 30 output signal. In the level-shift circuit 40 of FIG. 4, a +1.25V compensation voltage is input to the inverting side (−side) input terminal of the difference amplifier 41 to shift the level of the current detection section 20 output signal by −1.25V. In level-shift circuit 40 of FIG. 6, a −3.75V compensation voltage is input to the inverting side (−side) input terminal of the difference amplifier 41 to shift the level of the current detection section 30 output signal by +3.75V.

In the level-shift circuit 50 of FIGS. 5 and 7, which is an adder circuit 51, the current detection section 20, 30 output signal and a linear bias voltage are both input through resistors to the input-side of a gain=1 amplifier that outputs the sum of the current detection section 20, 30 signal and the linear bias voltage. In the level-shift circuit 50 of FIG. 5, a −1.25V linear bias voltage is added to the current detection section 20 signal to shift the level of the current detection section 20 output signal by −1.25V. In the level-shift circuit 50 of FIG. 7, a +3.75V linear bias voltage is added to the current detection section 30 signal to shift the level of the current detection section 30 output signal by +3.75V.

Here, the level-shifted signal from the level-shift circuit 40, 50 has an output voltage range of 0V to 8.75V corresponding to a charging current of 150 A to a discharging current of 200 A. If the input voltage range of the A/D converter is equal to the output voltage range of the level-shift circuit, the level-shift circuit output signal can be directly input to the A/D converter for conversion to a digital signal. However, in a circuit where the input voltage range of the A/D converter is not equal to the voltage range of the level-shift circuit, an amplitude adjustment circuit adjusts the range of the level-shift circuit output signal for input to the A/D converter. When the output voltage range of the level-shift circuit is larger than the input voltage range of the A/D converter, the amplitude adjustment circuit is an attenuating circuit. In contrast, when the output voltage range of the level-shift circuit is smaller than the input voltage range of the A/D converter, the amplitude adjustment circuit is an amplifying circuit. For example, an amplifying amplitude adjustment circuit can be implemented by adjusting the gain of the difference amplifier or adder amplifier that makes up the level-shift circuit.

In the current detection apparatus of FIGS. 4-7, the output voltage range of the level-shift circuit 40, 50 is 0V to 8.75V, and the input voltage range of the A/D converter is 0V to 5V. Therefore, the amplitude adjustment circuit 61 to adjust the output voltage range of the level-shift circuit 40, 50 is an attenuating circuit that reduces the 8.75V range to 5V. This amplitude adjustment circuit 61 outputs values that are 5/8.75 times the input signal.

The input voltage range of many general-purpose A/D converters is 0V to 5V. If the output voltage range of the current detection section is 10V, the output voltage range of the current detection section is larger than the input voltage range of the A/D converter and an attenuating amplitude adjustment circuit is used. An amplitude adjustment circuit 61, which is an attenuating circuit, can be implemented by a resistive voltage divider circuit 62. As shown in FIGS. 4 and 7, an attenuating amplitude adjustment circuit 61 that outputs 5/8.75 times the input signal can be implemented by a resistive voltage divider circuit 62 having 3.75 kΩ and 5 kΩ resistors 63, 64 connected in series. This attenuating circuit can be implemented by connecting the 5 kΩ resistor 63 to ground, connecting the 3.75Ω resistor 64 to the output-side of the level-shift circuit 40, 50, and connecting the node common to both resistors 63, 64 to the input-side of the A/D converter 60. Note, if the output voltage range of the current detection section is 0V to 5V, an amplitude adjustment circuit is unnecessary and system accuracy can be further improved.

The A/D converter 60 converts the 0V to 5V input from the amplitude adjustment circuit 61 to a digital signal. It thereby converts and outputs a digital signal for the charging current and discharging current of the battery 10. The digital signal output from the A/D converter 60 is input to a computation circuit 70. The computation circuit 70 computes battery 10 discharging current and charging current from the input digital signal. The computation circuit 70 has a function stored in memory, which is the straight-line C for FIGS. 4 and 5 and the straight-line G for FIGS. 6 and 7. The computation circuit 70 computes a current value corresponding to the input digital signal based on the stored function. The computation circuit 70 computes a charging current of 150 A for a 0V digital signal, a 200 A discharging current for a 5V digital signal, and 0 A for a 2.14V digital signal input from the A/D converter 60. In the car power source, battery 10 remaining capacity is computed from battery 10 charging current and discharging current computed by the computation circuit 70 of the current detection apparatus. The battery ECU 14 controls charging current and discharging current while battery 10 current is detected by the current detection apparatus.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the spirit and scope of the invention as defined in the appended claims. The present application is based on Application No. 2007-68593 filed in Japan on Mar. 16, 2007, the content of which is incorporated herein by reference.

What is claimed is:

1. A current detection apparatus for a car power source comprising:
   a car driving battery;
   a current detection section that detects a charging current and a discharging current of the car driving battery;
   a level-shift circuit connected to an output-side of the current detection section, the level-shift circuit being configured to shift both charging current and discharging current output signals of the current detection section; and
   an A/D converter connected to an output-side of the level-shill circuit,
   wherein the level-shift circuit shifts the current detection section charging current and discharging current output signals to unbalance a maximum discharging current and a maximum charging current to be detected so that a range of the charging current is narrower than a range of the discharging current received by the A/D converter, wherein the level-shift circuit is configured to shift both charging current and discharging current output signals of the current detection section so that a shifted-line of charging/discharging current-to-voltage is parallel to an original line and the shifted-line and the original line have the same slope.

2. The current detection apparatus of claim 1, further comprising:
   a battery ECU configured to control the battery discharging current and the charging current, wherein the battery ECU controls larger discharging currents than charging currents.

3. The current detection apparatus claim 1 wherein the level-shift circuit is a difference amplifier; in the level-shift circuit that is a difference amplifier, current detection section output is input to one input terminal and a DC compensation voltage is input to the other input terminal to shift the current detection section output signal by the compensation voltage and input it to the A/D converter.

4. The current detection apparatus for a car power source as cited in claim 3 wherein the level-shift circuit is a difference amplifier; the current detection section output signal is input to the non-inverting side (+side) input terminal and a compensation voltage is input to the inverting side (−side) input terminal to shift the level of the current detection section output signal.

5. The current detection apparatus for a car power source as cited in claim 4 wherein the level-shift circuit is a difference amplifier with a voltage gain of one.

6. The current detection apparatus of claim 1, wherein the level-shift circuit is an adder circuit, and a DC bias voltage is input to an input-side of the adder circuit to shift a current detection section output signal by the DC bias voltage and input it to the A/D converter.

7. The current detection apparatus of claim 6, wherein the level-shift circuit is an adder circuit, and the current detection section output signal and a linear bias voltage are both input through a resistor to an input-side of an amplifier, wherein a sum of the current detection section output signal and the linear bias voltage is output.

8. The current detection apparatus of claim 1, wherein the current detection section has output characteristics showing an output voltage increase with a discharging current increase, and an output voltage decrease with a charging current increase.

9. The current detection apparatus of claim 1, wherein the current detection section has output characteristics showing a linear output voltage increase with a battery current increase in a discharging direction.

10. The current detection apparatus of claim 1, further comprising:
an amplitude adjustment circuit provided at the output-side of the level-shift circuit to adjust an amplitude of a level-shift circuit output voltage to an input range of the A/D converter.

11. The current detection apparatus of claim 10, wherein the amplitude adjustment circuit is an attenuating circuit.

12. The current detection apparatus of claim 11, wherein the amplitude adjustment circuit, which is an attenuating circuit, is a resistive voltage divider circuit.

13. The current detection apparatus of claim 10, wherein the amplitude adjustment circuit is an amplifying circuit.

14. The current detection apparatus for a car power source as cited in claim 10 wherein the level-shift circuit is an op-amp that serves the dual purpose as an amplitude adjustment circuit, and the amplitude of the level-shift circuit output voltage is adjusted to the input range of the A/D converter by the gain of the op-amp.

15. The current detection apparatus of claim 1, wherein an input voltage range of the A/D converter is 0V to 5V.

16. The current detection apparatus of claim 1, further comprising:
a computation circuit connected to an output-side of the A/D converter, the computation circuit being configured to compute battery discharging current and charging current from a digital signal input from the A/D converter.

17. The current detection apparatus of claim 16, wherein the computation circuit has a function stored in a memory to compute current values corresponding to the input digital signal based on the stored function.

* * * * *